(12) United States Patent  
Gupta et al.

(10) Patent No.: US 11,043,488 B2
(45) Date of Patent: Jun. 22, 2021

(54) HIGH VOLTAGE PROTECTION FOR HIGH-SPEED DATA INTERFACE

(71) Applicant: Western Digital Technologies, Inc., San Jose, CA (US)

(72) Inventors: Nitin Gupta, Bangalore (IN); Ramakrishnan Subramanian, Bangalore (IN); Sitaram Banda, Vijayawada (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 140 days.

(21) Appl. No.: 16/256,945

(22) Filed: Jan. 24, 2019

(65) Prior Publication Data

US 2020/0243511 A1 Jul. 30, 2020

(51) Int. Cl.
*G11C 5/14* (2006.01)
*H01L 27/02* (2006.01)
*H01L 23/60* (2006.01)
*G11C 16/30* (2006.01)
*H01L 29/861* (2006.01)
*G11C 8/08* (2006.01)
*G11C 16/26* (2006.01)
*H01L 49/02* (2006.01)

(52) U.S. Cl.
CPC ........... *H01L 27/0288* (2013.01); *G11C 8/08* (2013.01); *G11C 16/26* (2013.01); *G11C 16/30* (2013.01); *H01L 23/60* (2013.01); *H01L 27/0255* (2013.01); *H01L 28/20* (2013.01); *H01L 29/861* (2013.01)

(58) Field of Classification Search
CPC ...................................................... G11C 16/30
USPC ........................................................ 365/226
See application file for complete search history.

(56) References Cited

U.S. PATENT DOCUMENTS

| 7,154,309 | B1 | 12/2006 | Talbot et al. |
| 7,482,711 | B2 | 1/2009 | Blaha |
| 7,483,329 | B2 | 1/2009 | Luo et al. |
| 8,400,183 | B1 | 3/2013 | Yeung et al. |
| 9,312,686 | B2 | 4/2016 | Kumar et al. |
| 2008/0071486 | A1* | 3/2008 | Ikejiri ............ G01R 31/318385 702/64 |
| 2008/0175045 | A1* | 7/2008 | Lin ..................... H03K 3/35625 365/182 |
| 2013/0342943 | A1 | 12/2013 | Yuuki et al. |

(Continued)

*Primary Examiner* — Min Huang
(74) *Attorney, Agent, or Firm* — Loza & Loza, LLP; Gabriel Fitch

(57) ABSTRACT

Various apparatuses, systems, methods, and media are disclosed to provide over-voltage protection to a data interface of a multi-protocol memory card that includes a first communication interface and a second communication interface that enable communication using different protocols. An interface voltage protection circuit includes a control circuit configured to receive a first supply voltage for operating the first communication interface. The interface voltage protection circuit further includes a pull-down circuit operatively connected with the control circuit, configured to pull down a voltage at a supply voltage rail of the second communication interface such that a voltage at a plurality of connector terminals of the second communication interface is lower than the first supply voltage.

22 Claims, 8 Drawing Sheets

(56) References Cited

U.S. PATENT DOCUMENTS

2017/0206974 A1* 7/2017 Kong .................... G06F 3/0625
2018/0088865 A1* 3/2018 Lee ...................... G06F 3/0604
2019/0317587 A1* 10/2019 Hsu ...................... G06F 1/3275

* cited by examiner

HIGH VOLTAGE PROTECTION FOR HIGH-SPEED DATA INTERFACE

FIELD

The disclosure relates, in some aspects, to protection circuitry for memory card interface. More specifically, but not exclusively, the disclosure relates to high voltage protection for data interface of a multi-protocol memory card.

INTRODUCTION

Solid state devices (SSDs) incorporating non-volatile memories (NVMs), such as flash NAND memories, are replacing or supplementing conventional rotating hard disk drives for mass storage in many consumer or industrial electronics and computers. One exemplary SSD is a flash memory card such as Secure Digital (SD) card or the like. Some flash memory cards can support one or more data interface standards, for example, SD interface and PCIe (Peripheral Component Interconnect Express) interface. A memory card that provides multiple data interfaces for different communication protocols may be called a multi-protocol memory card. Each data interface of a multi-protocol memory card has connector terminals (e.g., pads or contacts) for data inputs and outputs. A host computing device may communicate with a multi-protocol memory card through a memory card interface (e.g., a memory card slot) that supports one or more data interface standards.

A memory card slot has contacts, pins, or connectors that physically connect with the connector terminals of the memory card when it is inserted into the memory card slot. In some examples, the memory card slot supports data communication over only one of the data interfaces of the multi-protocol memory card. In that case, the host and/or the memory card slot may pull-up the connector terminals of the memory card corresponding to the unused data interface. However, the different data interfaces of the memory card may have different nominal operating voltages, and the pull-up voltage applied to the unused connector terminals may be too high and can cause damage to the interface circuitry of the memory card.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One aspect of the present disclosure provides a data storage apparatus that includes a non-volatile memory (NVM), a first communication interface, a second communication interface, and an interface protection component. The first communication interface is configured to provide access to the NVM using a first protocol and a first supply voltage. The second communication interface is configured to provide access to the NVM using a second protocol that is different from the first protocol and a second supply voltage. The interface protection component is configured to control a voltage at a supply voltage rail of the second communication interface such that a voltage at a plurality of connector terminals of the second communication interface is lower than the first supply voltage.

Another aspect of the present disclosure provides a method of operating a data storage apparatus including a first communication interface and a second communication interface that enable communication using different protocols. The data storage apparatus receives a first supply voltage from a host for operating the first communication interface. The data storage apparatus controls a voltage at a supply voltage rail of the second communication interface such that a voltage at a plurality of connector terminals of the second communication interface is lower than the first supply voltage.

Another aspect of the present disclosure provides an interface voltage protection circuit for a data storage apparatus including a first communication interface and a second communication interface that enable communication using different protocols. The interface voltage protection circuit includes a control circuit configured to receive a first supply voltage for operating the first communication interface. The interface voltage protection circuit further includes a pull-down circuit operatively connected with the control circuit, configured to pull down a voltage at a supply voltage rail of the second communication interface such that a voltage at a plurality of connector terminals of the second communication interface is lower than the first supply voltage.

Another aspect of the present disclosure provides a data storage apparatus that includes a non-volatile memory (NVM), a first communication means, a second communication means, and an interface protection means. The first communication means is configured to provide access to the NVM using a first protocol and a first supply voltage. The second communication means is configured to provide access to the NVM using a second protocol that is different from the first protocol and a second supply voltage. The interface protection means is configured to control a voltage at a supply voltage rail of the second communication means such that a voltage at a plurality of connector terminals of the second communication means is lower than the first supply voltage.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific aspects illustrated in the appended drawings. Understanding that these drawings depict only certain aspects of the disclosure and are not therefore to be considered to be limiting of its scope, the disclosure is described and explained with additional specificity and detail through the use of the accompanying drawings, in which.

DETAILED DESCRIPTION

Figure 1:
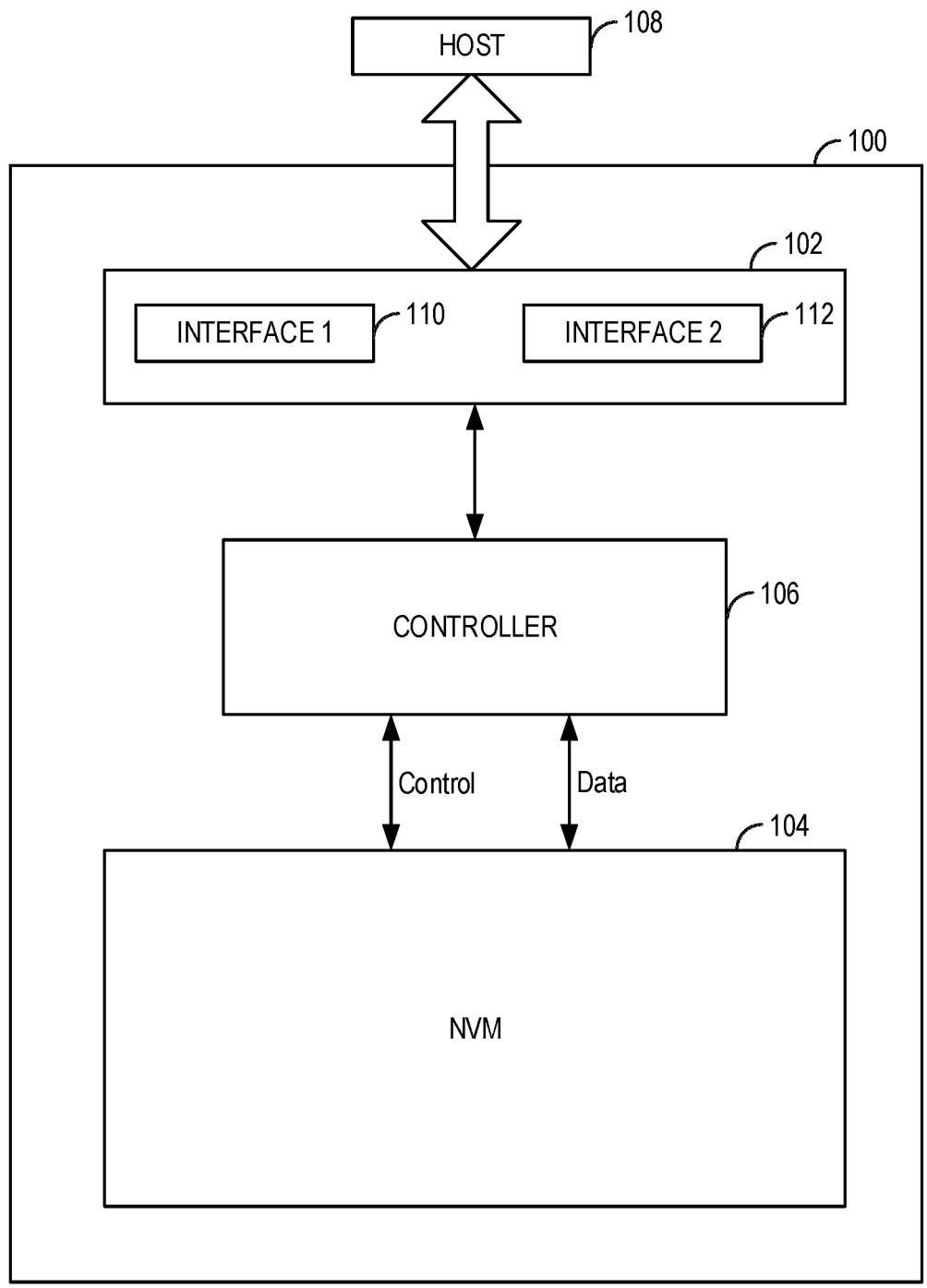
FIG. 1 illustrates an example of a multi-protocol memory card in accordance with one or more aspects of the disclosure.

In the following detailed description, reference is made to the accompanying drawings, which form a part thereof. In addition to the illustrative aspects, aspects, and features described above, further aspects, aspects, and features will become apparent by reference to the drawings and the following detailed description. The description of elements in each figure may refer to elements of proceeding figures. Like numbers may refer to like elements in the figures, including alternate aspects of like elements.

The disclosure relates in some aspects to various apparatuses, systems, methods, and media for providing overvoltage protection to the data interface of a multi-protocol memory card. A multi-protocol memory card has connector terminals associated with different data interfaces. In one example, the multi-protocol memory card may have connector terminals for a Secure Digital (SD) interface and a Peripheral Component Interconnect Express (PCIe) interface. In other examples, the memory card may support other interface standards.

For purposes of illustration, various aspects of the disclosure will be described in the context of a memory card that includes NAND memory technology. A NAND device may be referred to herein as a NAND Flash memory, a NAND memory device, a NAND flash, or a NAND. Generally speaking, a NAND device is a non-volatile memory having high storage density, fast access time, low power requirements in operation and advantageous shock resistance, compared to more conventional memory platforms. Raw NAND devices may be equipped (e.g., configured) with a serial interface such as Open NAND Flash Interface (ONFi), Common Flash Memory Interface (CFI), and the like. NAND devices may be configured as discrete memory chips or packaged with a controller to form a secure digital (SD) memory card, Multi Media Card (MMC), or a solid state disk. A NAND device may be configured with a single flash die or a plurality of dies. In addition to memory cells, a NAND device may include other components, such as control/address logic components, I/O components, and data register components. It should be appreciated that the teachings herein are also applicable to other forms of memory (e.g., NVM other than NAND devices).

A host computing device may have a memory card slot or socket (e.g., an SD card slot) configured to receive the memory card. The memory card slot may have contact pins that are positioned to physically mate with the corresponding connector terminals of a memory card. The host computing device or the memory card slot may apply a pull-up voltage to the connector terminals of the data interface that is not used or supported by the host. In some examples, the pull-up voltage may be higher than the voltage tolerance level of the unused interface. In view of the above deficiencies, the disclosure relates in some aspects to an apparatus and a method for controlling a supply voltage of the unused data interface to protect the unused data interface from a high pull-up voltage applied by the host computing device or the memory card slot. These aspects and other aspects of the disclosure will now be described in more detail in conjunction with FIGS. 1-7.

Example Memory Card

FIG. 1 illustrates an aspect of a multi-protocol memory card 100 that includes a host interface 102, a non-volatile memory (NVM) 104, and a controller 106 communicatively coupled to the host interface 102 and NVM 104. In one aspect of the disclosure, the NVM 104 may include NAND flash memory or other non-volatile memory. The controller 106 serves as the interface between the NVM 104 and the host interface 102, which may be connected to a host device's memory card interface or a memory card slot. The controller 106 controls various operations of the memory card 100, for example, for storing data to and reading data from the NVM 104. The controller 106 may include any type of processing device, such as a microprocessor, a microcontroller, an embedded controller, a logic circuit, software, firmware, or the like, for controlling operation of the memory card 100. In various aspects, the controller 106 receives commands from the host device 108 through the host interface 102 and performs the commands to transfer data between the host device 108 and the NVM 104. Each command, therefore, results in the execution/performance of an associated operation (e.g., a read operation, write/program operation, erase operation, etc.). In addition, the controller 106 may perform internal operations such as garbage collection operations, data integrity operations, and wear leveling operations.

The NVM 104 may be made up of one or more non-volatile memory dies (e.g., Flash memory dies). As used herein, the term die refers to the set of non-volatile memory cells, and associated circuitry for managing the physical operation of those non-volatile memory cells, that are formed on a single semiconductor substrate. The controller 106 can retrieve data from the NVM 104 and transmits the data to the host device 108 via the host interface 102. In some examples, the host device may be a computing device, a personal computer, a portable computer, or workstation, a server, a personal digital assistant, a digital camera, a digital phone, or the like. In some aspects of the disclosure, the controller 106 can support multiple communication protocols (e.g., SD interface and PCIe interface) and perform all the necessary control operations of the NVM 104 like read, write, erase, format, etc.

The host interface 102 is configured to communicate with the host 108 using different data interfaces for different communication protocols. The host interface 102 provides multiple physical connectors for electrically coupling to various host devices (e.g., host 108). In some aspects, the connectors may be implemented using connector terminals, which may include pins, pads, or other suitable means of making electrical connections that provide for removeable coupling between devices. In one aspect of the disclosure, the host interface 102 has a first set of interface connector terminals 110 (interface 1) and a second set of interface connector terminals 112 (interface 2). In one example, the host 108 may use the first interface (interface 1) to access the memory card 100 using an SD communication protocol, and the second interface (interface 2) to access the memory card 100 using a PCIe communication protocol. However, the host interface 102 is not limited to a SD interface or a PCIe interface. In some aspects of the disclosure, the host interface 102 may support other types of communication interfaces, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some aspects, the memory card 100 may include or may be a solid state device (SSD).

Figure 2:
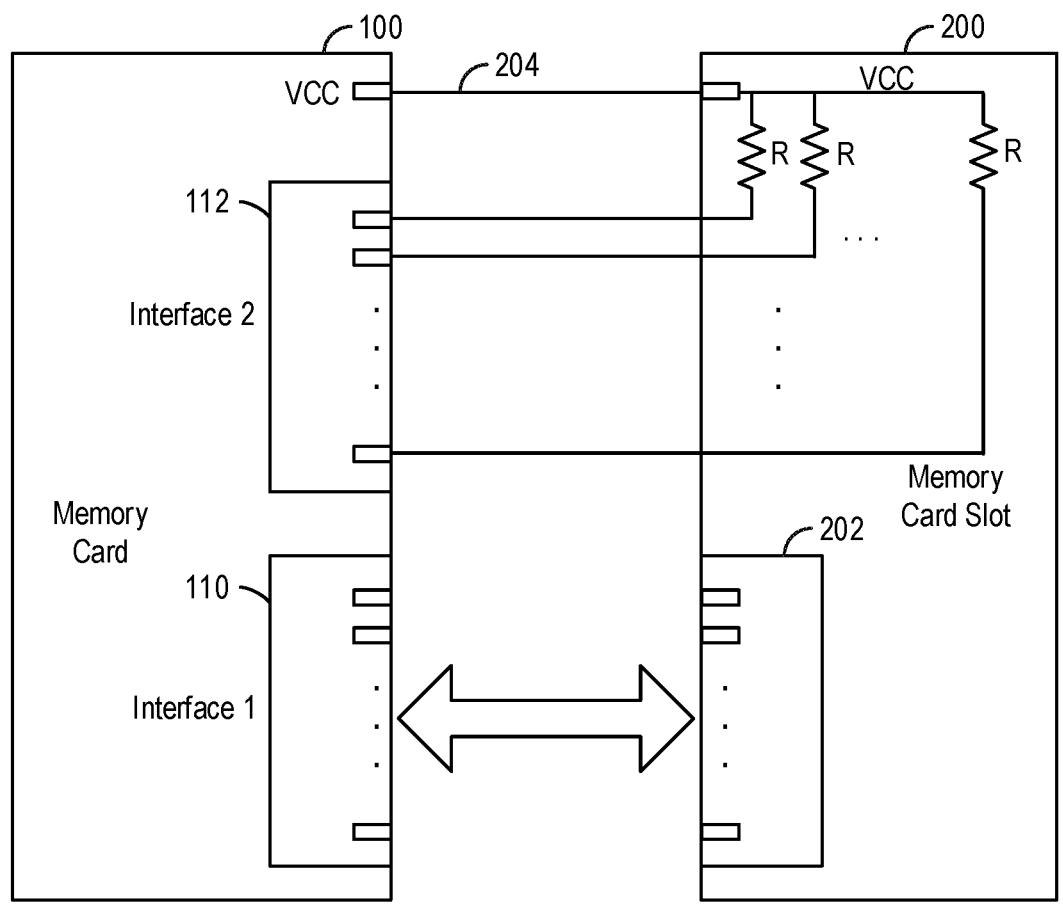
FIG. 2 illustrates the multi-protocol memory card of FIG. 1 coupled with a memory card slot in accordance with one or more aspects of the disclosure.

FIG. 2 conceptually illustrates the multi-protocol memory card 100 and a memory card slot 200 according to one aspect of the disclosure. In some aspects, the memory card slot 200 may be a part of the host 108 of FIG. 1. In some other aspects, the memory card slot 200 may be included in a card reader (not shown) that is communicatively connected to the host 108 by a data connection (e.g., USB connection, WiFi connection). In this example, the multi-protocol memory card 100 provides two data interfaces, illustrated as interface 1 including the first interface connector terminals 110 and interface 2 including the second interface connector terminals 112. Interface 1 and interface 2 are configured for different communication protocols. In some aspects, interface 1 may be an SD interface, and interface 2 may be a PCIe interface.

The memory card slot 200 has contact pins 202 that are configured to couple with interface 1 (e.g., SD interface) of the memory card 100. When the memory card 100 is inserted into the memory card slot 200, the interface 1's connector terminals 110 make contact with the corresponding contact pins 202 of the memory card slot. Although not shown for brevity, the memory card slot 200 may have other contact pins that make contact with the interface 2's connector terminals 112. In this example, the memory card 100 uses interface 1 (e.g., SD interface) to communicate with a host via the memory card slot 200, but interface 2 (e.g., PCIe interface) is not used or supported by the host or memory card slot. While interface 2 is not used for data communication, the host or memory card slot 200 may apply a pull-up or pull-down voltage to the second interface connector terminals 112. In some aspects, interface 1 and interface 2 use different supply voltages. For example, in one aspect, interface 1 uses a 3.3V supply voltage, and interface 2 uses a 1.8V supply voltage. In this case, when the host or memory card slot applies a 3.3V pull-up voltage (VCC) to the interface 2's connector terminals 112, the input and output circuitry of interface 2 may thereby be subjected to a voltage higher than a voltage tolerance level of interface 2.

In some examples, a snapback electrostatic discharge (ESD) protection circuit or the like may be connected to the interface's input/output connections to provide ESD protection. If the high speed interface pins (e.g., interface 2) need to be 3.3V tolerant, the snap-back ESD protection scheme may be used. However, the snapback ESD protection circuit can introduce a significant capacitance and deteriorate communication performance (e.g., signaling speed). In some examples, a voltage limiter circuit or the like may be connected to the interface's input/output connections to provide over-voltage or high-voltage protection. However, a voltage limiter solution may still undesirably affect the communication performance of the interface.

Example High Voltage Protection Circuit

Figure 3:
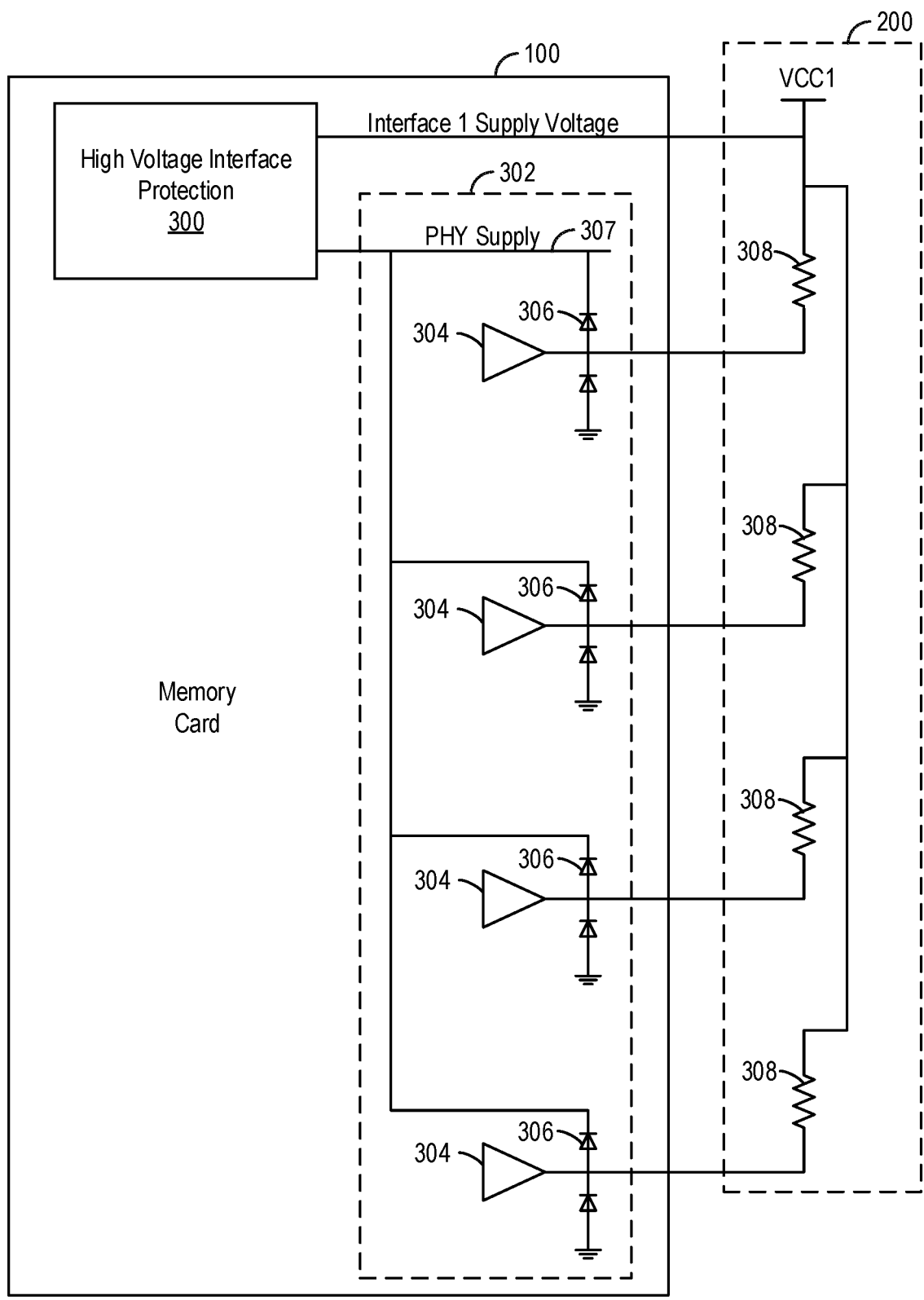
FIG. 3 illustrates the multi-protocol memory card including a high voltage interface protection block in accordance with one or more aspects of the disclosure.

FIG. 3 conceptually illustrates the multi-protocol memory card 100 with a high voltage interface protection block 300 according to some aspects of the disclosure. As described above in relation to FIGS. 1 and 2, when the memory card 100 is inserted into the memory card slot 200, interface 2 (e.g., PCIe interface) may not be used for communication. An exemplary input-output circuit 302 of interface 2 is shown in FIG. 3. In some aspects, the input-output circuit 302 may be a part of the physical layer (PHY) portion of interface 2. In FIG. 3, four exemplary output buffers 304 are conceptually shown with their respective diode clamping circuits 306 connected between a PHY supply voltage rail and a ground reference (ground). The outputs of the output buffers 304 may be connected to the corresponding interface connector terminals 112. In some aspects, the input-output circuit 302 may have any combination of outputs and inputs.

When interface 2 is not used, the outputs and/or inputs (interface connector terminals 112) of interface 2 are pulled up to the supply voltage (VCC1) of interface 1. In some aspects, interface 1 may be an SD interface that uses 3.3V as the supply voltage. In FIG. 3, all outputs of the output buffers 304 are pulled up to VCC1 via respective pull-up resistors 308. The high voltage interface protection block 300 is configured to control or limit the voltage at the inputs and outputs of interface 2. To that end, the high voltage interface protection block 300 along with the diode clamping circuits 306 pull down the voltage at the PHY supply voltage rail 307 of the output circuit 302 such that the voltage at the inputs and outputs of interface 2 is lower than interface 2's voltage tolerance level. For example, the voltage at the outputs of the buffers 304 can be kept at a voltage that is about one diode drop above the voltage at the PHY supply voltage rail. For example, one diode drop may be about 0.6V to 0.7V. Therefore, if the voltage at the PHY supply voltage rail 307 is about 0V or ground, the voltage at the inputs and outputs of interface 2 can be kept at about 0.6V to 0.7V. In other aspects of the disclosure, the high voltage interface protection block 300 can set the voltage at the inputs and outputs of interface 2 to any desired values below the interface 2's voltage tolerance level.

Figure 4:
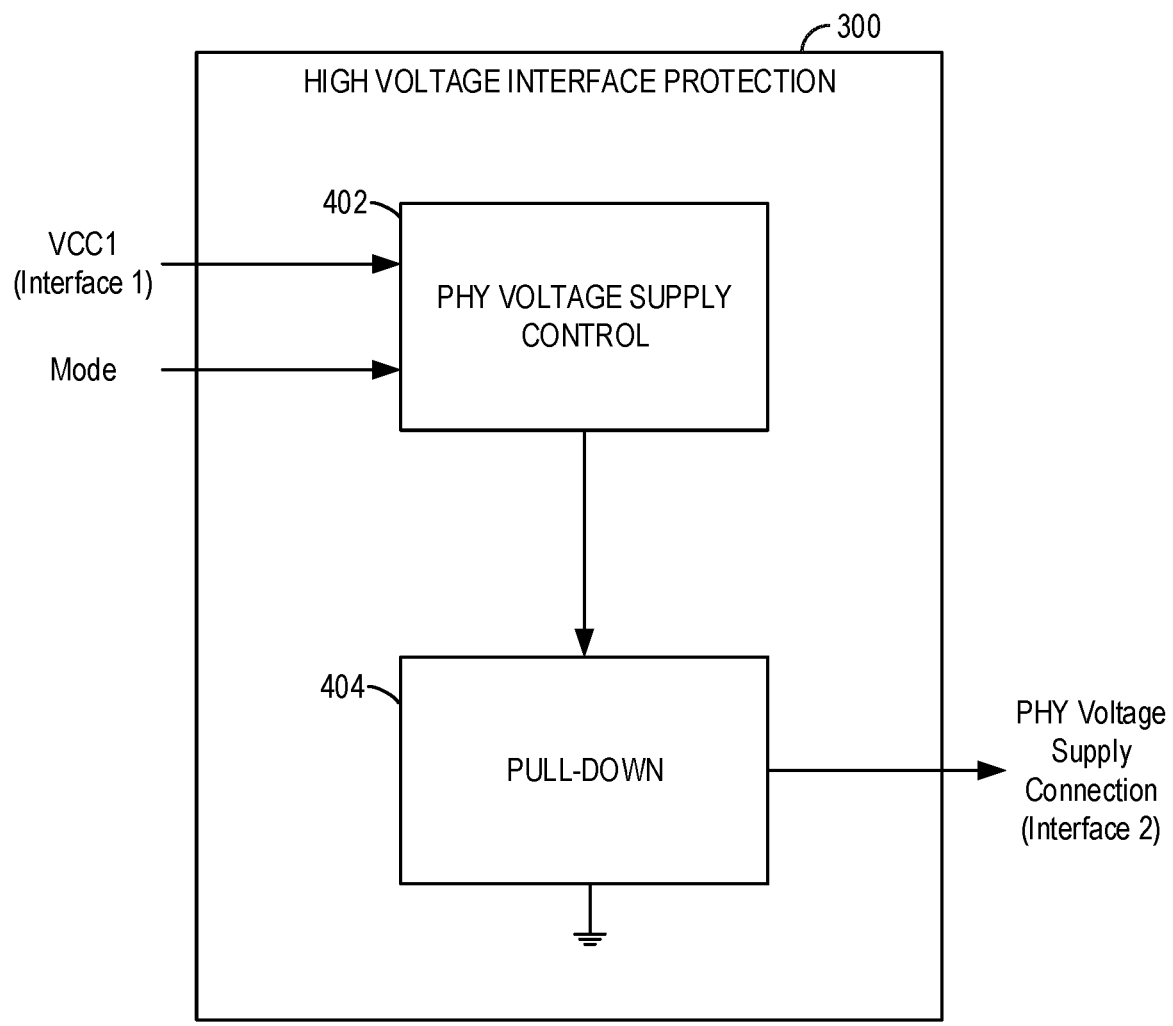
FIG. 4 illustrates a high voltage interface protection block in accordance with one or more aspects of the disclosure.

FIG. 4 illustrates an aspect of the high voltage interface protection block 300 that includes a PHY supply voltage control block 402 and a pull-down block 404. The PHY supply voltage control block 402 is configured to control (e.g., activate or deactivate) the pull-down block 404 based on the supply voltage (VCC1) of interface 1 and a mode signal. The PHY supply voltage control block 402 may be implemented in any type of hardware, software, and/or firmware. As described above, interface 1 may be an SD interface that is used by the memory card 100 to communicate with a host via the memory card slot 200. The pull-down block 404, when enabled or activated, is configured to pull down the voltage at the PHY supply voltage rail of interface 2. In one example, interface 2 may be a PCIe interface. The mode signal controls the PHY supply voltage control block 402 to enable or disable the pull-down block 404. For example, the mode signal may be set to a first state and a second state. When the mode signal is at the first state (e.g., enabled or "on" state), the PHY supply voltage control block 402 activates the pull-down block 404. When the mode signal is at the second state (e.g., disabled or 37 off"

state), the PHY supply voltage control block 404 deactivates the pull-down block 404. When the pull-down block 404 is enabled or turned on, it pulls down the voltage at the PHY supply voltage rail 307 (see FIG. 3). When the pull-down block 404 is disabled or turned off, it does not pull down the voltage at the PHY supply voltage rail 307.

Examples of Pull-Down Circuit

Figure 5:
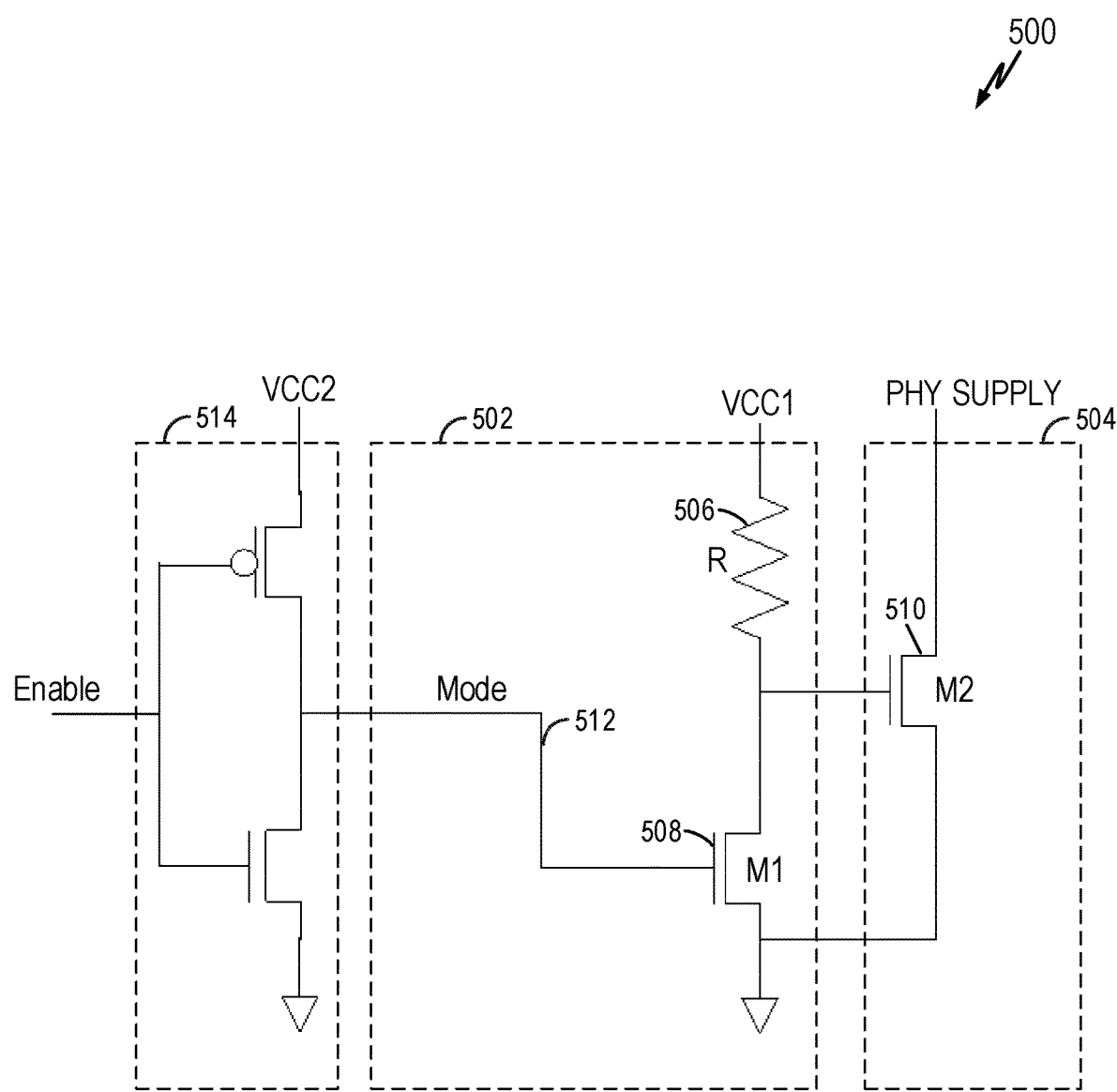
FIG. 5 illustrates a first hardware implementation of the high voltage interface protection block in accordance with one or more aspects of the disclosure.

FIG. 5 illustrates an example of a high voltage interface protection block 500 that includes a PHY supply voltage control block 502 and a pull-down block 504. The PHY supply voltage control block 502 includes a weak pull-up resistor 506 and a first transistor M1 508 connected in series between VCC1 and ground. VCC1 is the supply voltage of interface 1 supplied by the host when the memory card is inserted into a memory card slot. In one aspect, when interface 1 is an SD interface, VCC1 may be 3.3V. The pull-down block 504 includes a second transistor M2 510 connected between a PHY supply voltage rail (illustrated as PHY Supply in FIG. 3) and a ground reference. The gate or control terminal of the second transistor M2 is pulled up to VCC1 by the weak pull-up resistor 506. In one example, the weak pull-up resistor 506 may have a resistance of about 50K Ohms. In one aspect, the voltage at the PHY supply voltage rail is the PHY supply voltage of interface 2. In some examples, interface 2 may be a PCIe interface. In some aspects, the transistors M1 and M2 may be P-type transistors (e.g., P-type metal-oxide-semiconductor field-effect transistor (MOSFET)). In some aspects, the transistors M1 and M2 may be replaced by other types of switches.

When the memory card 100 is inserted into a memory card slot 200 that supports data communication using only interface 1 (e.g., SD interface), the supply voltage (VCC1) of interface 1 may be supplied by the host. For example, VCC1 may be 3.3V for an SD interface. The mode signal 512 may initially be at a low level (e.g., state "0") because VCC2 is not supplied by the host or memory card slot. When the mode signal is at a low level, the first transistor M1 is turned off. At the same time, the supply voltage VCC1 ramps up the gate voltage of the second transistor M2 and as a result turns on the second transistor M2. When the second transistor M2 is turned on, the voltage at the PHY supply voltage rail is pulled down. The size of the second transistor M2 can be determined based on the desired clamping voltage and the value of the external pull-up resistors (e.g., resistors 308). In general, a larger second transistor M2 can provide a larger pull-down current that generates a larger voltage drop across the external pull-up resistors, resulting in a lower voltage at the inputs and outputs of interface 2. When a host supplies VCC2 and an enable signal to the inverter 514, but not VCC1, the mode signal 512 becomes a high-level signal (e.g., state "1") that turns on the first transistor M1. When the first transistor M1 is turned on, the gate voltage of the second transistor M2 is pulled down. As a result, the second transistor M2 is turned off, and the voltage at the PHY supply voltage rail is not pulled down.

Figure 6:
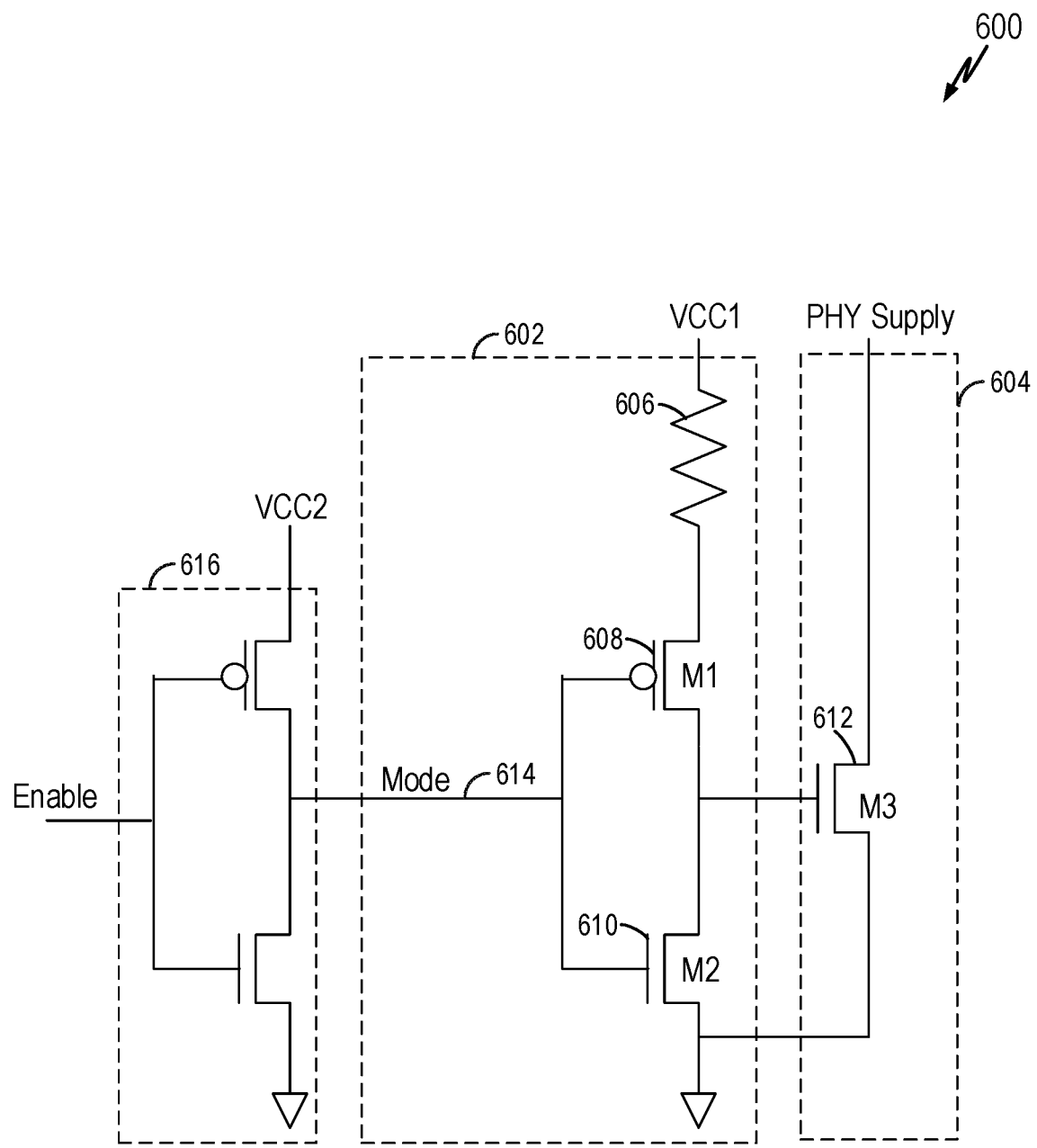
FIG. 6 illustrates a second hardware implementation of the high voltage interface protection block in accordance with one or more aspects of the disclosure.

FIG. 6 illustrates an example of a high voltage interface protection block 600 that includes a PHY supply voltage control block 602 and a pull-down block 604. The PHY supply voltage control block 602 includes a weak pull-up resistor 606, a first transistor M1 608, and a second transistor M2 610 that are connected in series between VCC1 and a ground reference. In one example, the weak pull-up resistor 606 may have a resistance of about 50K Ohms. VCC1 is the supply voltage of interface 1 supplied by the host when the memory card is inserted into a memory card slot. In one aspect, when interface 1 is an SD interface, VCC1 may be 3.3V. The pull-down block 604 includes a third transistor M3 612 connected between the PHY supply voltage rail and ground. In one aspect, the PHY supply voltage rail receives the PHY supply voltage of interface 2. In some examples, interface 2 may be a PCIe interface. In some aspects, the first transistor M1 may be an N-type transistor (e.g., N-type MOSFET), and transistors M2 and M3 may be P-type transistors (e.g., P-type MOSFET).

When the memory card is inserted into a memory card slot that supports data communication using only interface 1 (e.g., SD interface), the host supplies the supply voltage (VCC1) of interface 1. For example, VCC1 may be 3.3V for an SD interface. The mode signal 614 is initially at a low level (e.g., state "0") because VCC2 is not supplied by the host or memory card slot. When the mode signal is at a low level, the first transistor M1 is turned on and the second transistor M2 is turned off. At the same time, the supply voltage VCC1 (e.g., 3.3V) ramps up the gate voltage of the third transistor M3 and as a result turns on the third transistor M3. When the third transistor M3 is turned on, the voltage at the PHY supply voltage rail is pulled down. The size of the third transistor M3 can be determined based on the desired clamping voltage and the value of the external pull-up resistors (e.g., resistors 308). In general, a larger third transistor M3 can provide a larger pull-down current that generates a larger voltage drop across the external pull-up resistors. When the host supplies VCC2 and an enable signal to the inverter 616, but not VCC1, the mode signal 614 becomes a high-level signal (e.g., state "1") that turns off the first transistor M1 and turns on the second transistor M2. As a result, the third transistor M3 is turned off, and the PHY supply voltage is not pulled down.

First Example Process

Figure 7:
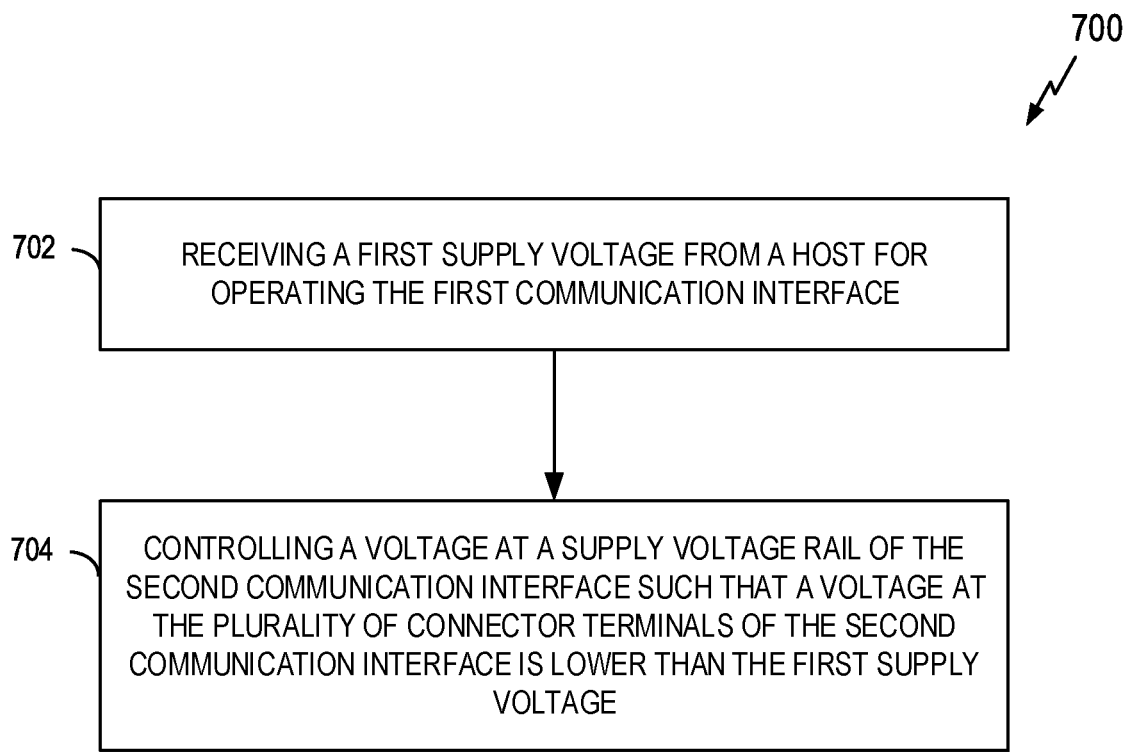
FIG. 7 illustrates an example process for protecting a memory card interface from high voltage in accordance with one or more aspects of the disclosure.

FIG. 7 illustrates a process 700 for protecting a memory card interface from high voltage in accordance with some aspects of the disclosure. The process 700 may take place within the multi-protocol memory card 100 or some other suitable apparatus. Of course, in various aspects within the scope of the disclosure, the process 700 may be implemented by any suitable apparatus capable of supporting memory card interface protection related operations.

At block 702, the memory card 100 receives a first supply voltage from a host for operating a first communication interface (interface 1). The first supply voltage is for operating the first communication interface. In one example, the first communication interface may be an SD interface, and the first supply voltage may be 3.3 V. In some aspects, the first communication interface may be the interface 1 described above in relation to FIGS. 1-6, and the host may be the host 108 of FIG. 1.

The memory card 100 may be inserted into a memory card slot 200 included in the host. In some examples, the memory card slot may be included in a memory card reader that is communicatively connected to the host via a data connection (e.g., a USB connection or WiFi connection). In some aspects, the memory card slot 200 may support only the first communication interface (e.g., SD interface), but not a second communication interface (e.g., PCIe interface) that is also available on the memory card 100. When the memory card 100 is inserted into such memory card slot, the memory card slot may pull up or down the connector terminals of the second communication interface (interface 2).

At block 704, the memory card 100 controls a voltage at a supply voltage rail of the second communication interface such that a voltage at the plurality of connector terminals of the second communication interface is lower than the first supply voltage or a desired voltage tolerance level. In some aspects, the supply voltage rail of the second communication interface may be the PHY supply voltage rail of the second communication interface. The memory card 100 may use the high voltage interface protection block 300 to control the voltage at the PHY supply voltage rail as described above in relation to FIGS. 4-6. For example, the memory card 100 pulls down the voltage at the PHY supply voltage rail of the second communication interface through a plurality of diode clamping circuits 306 (see FIG. 3). For example, when the voltage at the PHY supply voltage rail is kept near ground, the voltage at the connector terminals of the second communication interface is one diode drop above ground.

Figure 8:
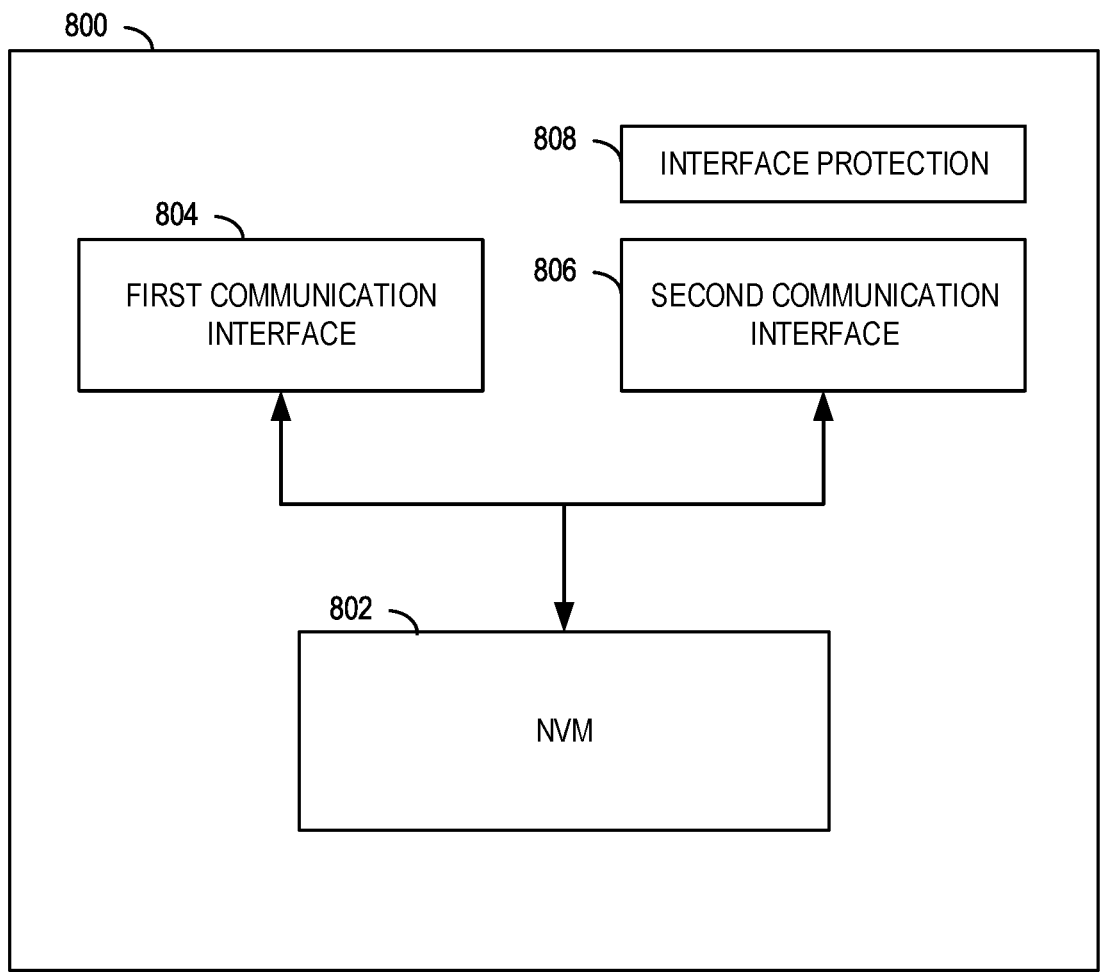
FIG. 8 is a block diagram illustrating an exemplary multi-protocol memory card in accordance with one or more aspects of the disclosure.

FIG. 8 is a block diagram illustrating an exemplary multi-protocol memory card 800 in accordance with one or more aspects of the disclosure. The multi-protocol memory card 800 includes a non-volatile memory (NVM) 802, a first communication means 804, a second communication means 806, and an interface protection means 808. In one aspect, the first communication means 804 may be implemented by the first set of interface connector terminals 110 (see FIG. 1) that are configured to provide access to the NVM 802 using a first protocol and a first supply voltage. The NVM 802 may be flash memory. In one aspect, the second communication means 806 may be implemented by the second set of interface connector terminals 112 (see FIG. 1) that are configured to provide access to the NVM using a second protocol that is different from the first protocol and a second supply voltage. In one aspect, the interface protection means 808 may be implemented by the high voltage interface protection block 300 (see FIG. 3) that is configured to control a voltage at a supply voltage rail of the second communication means 806 such that a voltage at a plurality of connector terminals of the second communication means is lower than the first supply voltage.

Additional Aspects

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to aspects of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer-readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding aspects. For instance, an arrow may indicate a waiting or monitoring period of unspecified duration between enumerated steps of the depicted aspect.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example aspects. The example systems and components described herein may be configured differently than described. For example, elements may be added to, removed from, or rearranged compared to the disclosed example aspects.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific aspects of the invention, these should not be construed as limitations on the scope of the invention, but rather as examples of specific aspects thereof. Accordingly, the scope of the invention should be determined not by the aspects illustrated, but by the appended claims and their equivalents. Moreover, reference throughout this specification to "one aspect," "an aspect," or similar language means that a particular feature, structure, or characteristic described in connection with the aspect is included in at least one aspect of the present disclosure. Thus, appearances of the phrases "in one aspect," "in an aspect," and similar language throughout this specification may, but do not necessarily, all refer to the same aspect, but mean "one or more but not all aspects" unless expressly specified otherwise.

The terminology used herein is for the purpose of describing particular embodiments only and is not intended to be limiting of the embodiments. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage apparatus comprising:
   a non-volatile memory (NVM);
   a first communication interface configured to provide access to the NVM using a first protocol and a first supply voltage;
   a second communication interface configured to provide access to the NVM using a second protocol that is different from the first protocol and a second supply voltage; and
   an interface protection component configured to control a voltage at a supply voltage rail of the second communication interface using the first supply voltage such that a voltage at a plurality of connector terminals of the second communication interface is higher than the voltage at the supply voltage rail and lower than the first supply voltage.

2. The data storage apparatus of claim 1, wherein the interface protection component is further configured to reduce the voltage at the plurality of connector terminals to be lower than the first supply voltage responsive to the plurality of connector terminals being pulled up using the first supply voltage.

3. The data storage apparatus of claim 1, wherein the interface protection component comprises:
   a control circuit configured to receive the first supply voltage from a host that is communicatively connected with the first communication interface; and
   a pull-down circuit connected between the supply voltage rail of the second communication interface and a ground reference, and operated by the control circuit to control the voltage at the plurality of connector terminals based on the first supply voltage.

4. The data storage apparatus of claim 3, wherein the pull-down circuit comprises:
   a switch connected between the supply voltage rail of the second communication interface and the ground reference, configured to turn on to pull down the voltage at the plurality of connector terminals when the data storage apparatus receives the first supply voltage from the host.

5. The data storage apparatus of claim 4, wherein the switch is further configured to turn off when the data storage apparatus does not receive the first supply voltage from the host.

6. The data storage apparatus of claim 3, wherein:
   the control circuit comprises a resistor and at least one switch connected in series between the first supply voltage and the ground reference; and
   the at least one switch is configured to control the pull-down circuit.

7. The data storage apparatus of claim 6, wherein the at least one switch is further configured to disable the pull-down circuit responsive to the data storage apparatus receiving the second supply voltage from the host.

8. The data storage apparatus of claim 1, wherein:
   the second communication interface comprises a plurality of diode clamping circuits, each diode clamping circuit connected between a corresponding one of the connector terminals and the supply voltage rail of the second communication interface; and
   the interface protection component is further configured to pull down the voltage at the plurality of connector terminals through the diode clamping circuits.

9. The data storage apparatus of claim 1, wherein the NVM comprises flash memory.

10. A method of operating a data storage apparatus comprising a first communication interface and a second communication interface that enable communication using different protocols, the method comprising:
   receiving a first supply voltage from a host for operating the first communication interface; and
   controlling a voltage at a supply voltage rail of the second communication interface using the first supply voltage such that a voltage at a plurality of connector terminals of the second communication interface is higher than the voltage at the supply voltage rail and lower than the first supply voltage.

11. The method of claim 10, wherein the controlling comprises:
   controlling the voltage at the plurality of connector terminals using a plurality of diode clamping circuits, each diode clamping circuit connected between a corresponding one of the connector terminals and the supply voltage rail of the second communication interface.

12. The method of claim 11, wherein the controlling the voltage comprises:
   turning on a switch connected between the plurality of diode clamping circuits and a ground reference, to pull down the voltage at the plurality of connector terminals through the plurality of diode clamping circuits.

13. The method of claim 12, wherein the turning on the switch comprises:
   pulling up a voltage at a control terminal of the switch to the first supply voltage.

14. An interface voltage protection circuit for a data storage apparatus comprising a first communication interface and a second communication interface that enable communication using different protocols, the interface voltage protection circuit comprising:
   a control circuit configured to receive a first supply voltage for operating the first communication interface; and
   a supply voltage rail pull-down circuit operatively connected with the control circuit, configured to pull down a voltage at a supply voltage rail of the second communication interface using the first supply voltage such that a voltage at a plurality of connector terminals of the second communication interface is higher than the voltage at the supply voltage rail and lower than the first supply voltage.

15. The interface voltage protection circuit of claim 14, wherein the supply voltage rail pull-down circuit comprises a switch connected between the supply voltage rail of the second communication interface and a ground reference.

16. The interface voltage protection circuit of claim 15, wherein the control circuit is further configured to turn on the switch to pull down the voltage at the supply voltage rail of the second communication interface.

17. The interface voltage protection circuit of claim 16, wherein the control circuit is further configured to pull up a voltage at a control terminal of the switch to the first supply voltage.

18. The interface voltage protection circuit of claim 14, wherein the control circuit comprises:
   a resistor; and
   at least one switch in series with the resistor connected between the first supply voltage and a ground reference,
   wherein the resistor and the at least one switch are configured to activate the supply voltage rail pull-down circuit responsive to the resistor receiving the first supply voltage.

19. The interface voltage protection circuit of claim 18, wherein the control circuit further comprises a mode input for controlling the at least one switch to deactivate the supply voltage rail pull-down circuit.

20. The interface voltage protection circuit of claim 19, wherein the at least one switch comprises a first switch and a second switch connected in series, the first switch and the second switch configured to be controlled by a common mode input.

21. The interface voltage protection circuit of claim 20, wherein:
   the first switch comprises an N-type transistor; and
   the second switch comprises a P-type transistor.

22. A data storage apparatus comprising:
   a non-volatile memory (NVM);
   a first communication means for providing access to the NVM using a first protocol and a first supply voltage;
   a second communication means for providing access to the NVM using a second protocol that is different from the first protocol and a second supply voltage; and
   an interface protection means for controlling a voltage at a supply voltage rail of the second communication means using the first supply voltage such that a voltage at a plurality of connector terminals of the second communication means is higher than the voltage at the supply voltage rail and lower than the first supply voltage.

* * * * *